United States Patent
Na et al.

(10) Patent No.: US 9,544,990 B2
(45) Date of Patent: Jan. 10, 2017

(54) POWER MODULE PRINTED CIRCUIT BOARD

(71) Applicants: Hyundai Motor Company, Seoul (KR); Kia Motors Corporation, Seoul (KR)

(72) Inventors: Jung Hwan Na, Gyeonggi-do (KR); Sang Hoon Kwak, Gyeonggi-do (KR); Tae Hwan Chung, Incheon (KR); Gun Soo Kang, Gyeonggi-do (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 155 days.

(21) Appl. No.: 14/553,353

(22) Filed: Nov. 25, 2014

(65) Prior Publication Data

US 2016/0023561 A1 Jan. 28, 2016

(30) Foreign Application Priority Data

Jul. 28, 2014 (KR) .................. 10-2014-0095727

(51) Int. Cl.
*H02J 7/00* (2006.01)
*H05K 1/02* (2006.01)
*H02M 3/156* (2006.01)

(52) U.S. Cl.
CPC ....... *H05K 1/0227* (2013.01); *B60L 2270/147* (2013.01); *H02M 3/156* (2013.01); *H05K 1/0233* (2013.01); *H05K 2201/09663* (2013.01); *Y02T 10/7005* (2013.01)

(58) Field of Classification Search
CPC .... Y02T 90/14; Y02T 10/7005; Y02T 90/128; Y02T 10/7088; Y02T 90/163
USPC ........................................ 320/109
See application file for complete search history.

(56) References Cited

U.S. PATENT DOCUMENTS

| 6,108,199 A | * | 8/2000 | Bonardi | G06F 1/1601 361/679.37 |
|---|---|---|---|---|
| 2001/0020836 A1 | * | 9/2001 | Joch | H02P 1/16 318/434 |
| 2004/0080965 A1 | * | 4/2004 | Poon | H02M 3/158 363/125 |
| 2012/0092896 A1 | * | 4/2012 | Hachiya | B60L 11/1812 363/16 |

FOREIGN PATENT DOCUMENTS

| KR | 2003-0078148 A | 10/2003 |
|---|---|---|
| KR | 10-2005-0001677 A | 1/2005 |
| KR | 2006-0065441 A | 6/2006 |
| KR | 2008-0064564 A | 7/2008 |
| KR | 10-2010-0111794 A | 10/2010 |
| KR | 2011-0038523 A | 4/2011 |

* cited by examiner

*Primary Examiner* — Arun Williams
(74) *Attorney, Agent, or Firm* — Mintz Levin Cohn Ferris Glovsky and Popeo, P.C.; Peter F. Corless

(57) ABSTRACT

An analog control system configured to operate a converter in an electric vehicle battery charging system is provided. The analog control system includes a pulse width modulation (PWM) output unit that is configured to output a PWM signal to the converter and an integrated control unit that is configured to sense an input voltage and an output voltage of the converter. The analog control system may be implemented on a printed circuit board having a first ground voltage stage connected to the PWM output unit, a second ground voltage stage separated from the first ground voltage stage by a first predetermined interval and connected to the integrated control unit. A filtering unit is disposed between the first ground voltage stage and the second ground voltage stage to pass an output signal of a predetermined band from the PWM unit to the integrated control unit.

8 Claims, 11 Drawing Sheets

POWER MODULE PRINTED CIRCUIT BOARD

CROSS-REFERENCE TO RELATED APPLICATION(S)

Pursuant to 35 U.S.C. §119(a), this application claims the benefit of priority to Korean Patent Application No. 10-2014-0095727, filed on Jul. 28, 2014, the disclosure of which is incorporated herein in its entirety by reference.

TECHNICAL HELD

The present disclosure relates to a power module on a printed circuit board, and more particularly, analog control system configured to control a converter in an electric vehicle battery charging system capable of reducing noise from a pulse width modulation (PWM) controller for a converter analog control device for hybrid vehicle and electric vehicles.

BACKGROUND

Today many existing vehicles are mainly powered by gasoline engines. However, since the gasoline engine powered vehicles increase environmental pollution, vehicles powered by electric drive motors have been developed. While the electric vehicles may reduce environmental pollution, such vehicles may generally not be driven for substantial periods of time since such vehicles are battery powered. To resolve disadvantages encountered by both gasoline powered vehicles and electric vehicles as described above, a hybrid vehicle having functions of the gasoline powered vehicles and electric vehicles has been developed.

The hybrid electric vehicle has both the drive functions of vehicles employing the general gasoline engine and those employing the electric motor. In other words, the hybrid electric vehicle may be driven as a gasoline engine powered vehicle or as an electric vehicle. When the hybrid electric vehicle is driven using only battery power, an inverter drives a motor depending on power supplied from a main battery and an auxiliary battery to drive the vehicle. In such a system, the main battery charges the auxiliary battery through a converter and the converter adjusts an output voltage using a pulse width modulation (PWM) signal. The PWM signal is output by a converter analog control device. To detect whether the output voltage of the converter is output at a desired level, a central processing unit (CPU) is configured to sense both the input voltage and the output voltage of the converter analog control device.

In using such a system, noise may occur as a result of sensing the input and output voltages of the CPU, due to the PWM signal output from the converter analog control device. Thus, as illustrated in FIGS. 1A and 1B, an error may occur in the voltage readings sensed by the CPU. FIG. 1A illustrates an example in which as the voltage readings are sensed by the CPU. The output voltage of the converter may be required to remain constant, but instead fluctuates between about 13 V and 14.5 V. As a result, errors may occur. As may be appreciated from the data shown in FIG. 1B, due to the voltages sensed by the CPU, the input voltage of the converter does not remain constant and an error of about 40 V or more may occur. Accordingly, in the related art the control signal or the sensing result of the CPU, (i.e., the sensed voltages) may be distorted due to the noise of the analog control device and thus the analog control device may malfunction. Accordingly, a derating control of the output current may occur, thereby reducing accuracy of estimation of the output current.

SUMMARY

The present invention provides analog control system configured to operate a converter in an electric vehicle battery charging system capable of reducing noise from a pulse width modulation (PWM) controller for a converter analog control device for hybrid vehicle and electric vehicles capable of increasing stability and reliability of the converter analog control device.

The present invention provides an analog control system configured to operate a converter in an electric vehicle battery charging system that may a pulse width modulation (PWM) output unit configured to output a PWM signal to the converter; an integrated control unit configured to sense an input voltage and an output voltage of the converter; a first ground voltage stage connected to the PWM output unit; a second ground voltage stage separated from the first ground voltage stage by a first predetermined interval and connected to the integrated control unit; and a filtering unit disposed between the first ground voltage stage and the second ground voltage stage; The filtering unit may be configured to pass an output signal of a predetermined band from the PWM unit to the integrated control unit.

The analog control system may further include: a third ground voltage stage spaced apart from the first ground voltage stage and the second ground voltage stage by a second predetermined interval and connected to a vehicle ground to remove noise. The filtering unit may include an inductor, (e.g., a bead inductor), configured to block noise and to pass the signal of the predetermined band to the integrated control unit. The first ground voltage stage and the second ground voltage stage may be electrically connected to each other through a single contact. The first ground voltage stage and the second ground voltage stage may be spaced apart from each other by about 3 mm to 10 mm. The analog control system may be implemented on a printed circuit board including a plurality of stacked layers. When the power module printed circuit board is configured of the plurality of stacked layers, the filtering unit may be disposed on a top layer and a bottom layer among the plurality of stacked layers at the same.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION

Figure 1A:
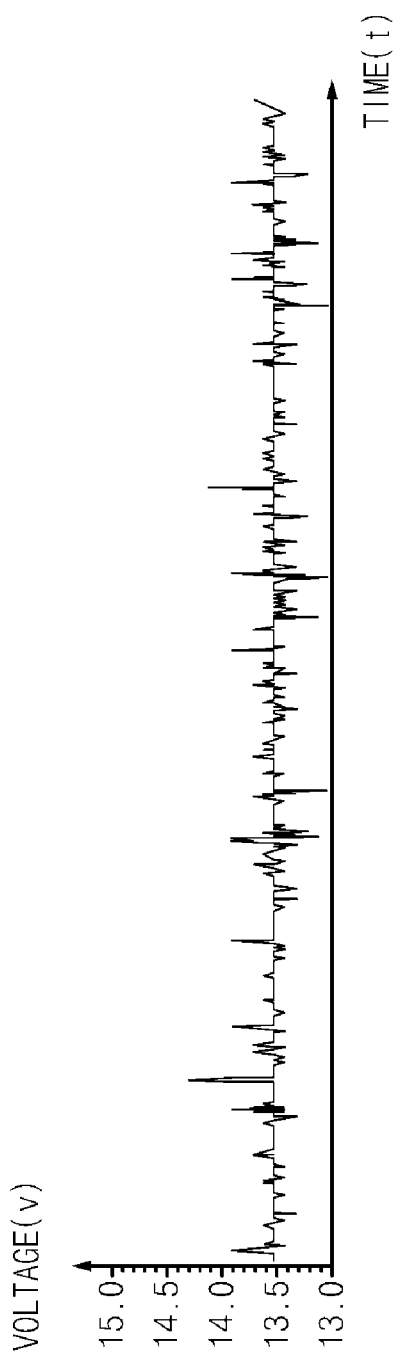
FIG. 1A is an exemplary graph illustrating a converter output voltage sensing error according to the related art.
Figure 1B:
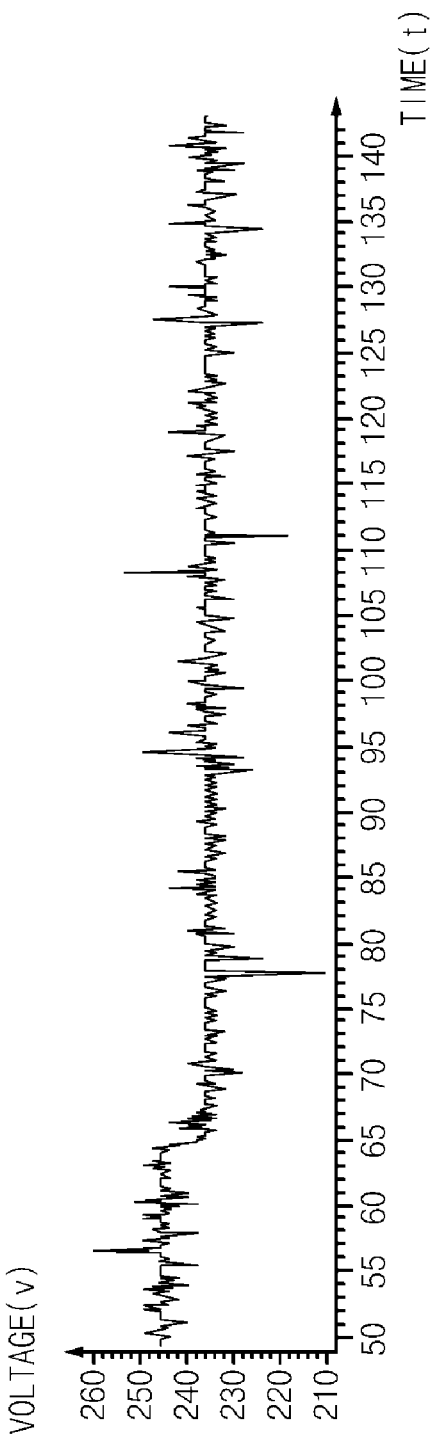
FIG. 1B is an exemplary graph illustrating a converter input voltage sensing error according to the related art.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, exemplary embodiments of the present invention will be described in detail with reference to the accompanying drawings so that those skilled in the art may easily practice the present invention. The present technology relates to a noise improvement printed circuit board (PCB) design technique of a converter analog control device operating a converter for a hybrid vehicle and an electric vehicle.

Figure 2:
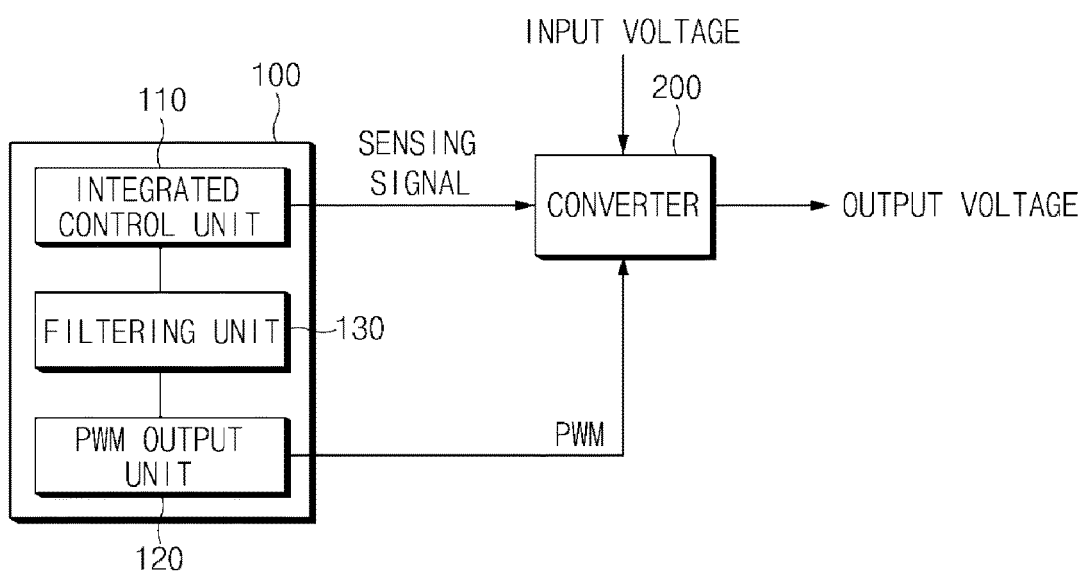
FIG. 2 is an exemplary diagram of a converter analog control device according to an exemplary embodiment of the present invention.

Exemplary embodiments of the present invention will be described with reference to FIGS. 2 to 4B. FIG. 2 is an exemplary configuration diagram of a converter analog control device included in a power module of a vehicle according to an exemplary embodiment of the present invention. A converter analog control device 100 according to an exemplary embodiment of the present invention may be configured to control an output voltage of a converter 200 and may include an integrated control unit 110, a PWM output unit 120, and a filtering unit 130.

The integrated control unit 110 may be configured to sense an input voltage and an output voltage of the converter 200 to operate the PWM output unit 120 when the output voltage is not output at predetermined level. In other words, the integrated control unit 110 may be configured to operate the PWM output unit 120 to increase a PWM output level when the output voltage level of the converter 200 is less than the predetermined level and operate the PWM output unit 120 to reduce the PWM output level when the output voltage level of the converter 200 is greater than the predetermined level. The PWM output unit 120 may be configured to output a PWM signal based on a control signal of the integrated control unit 110. In particular, the PWM signal may be a pulse signal which swings a predetermined voltage level range.

The filtering unit 130 may be disposed between the integrated control unit 110 and the PWM output unit 120 to pass a signal of a specific band. In other words, an effect of noise due to the PWM signal on the integrated control unit 110 may be reduced or minimized by passing the signal of the specific band in the PWM signal output from the PWM output unit 120 through the integrated control unit 110.

To more accurately describe a possible position of the filtering unit 130, the printed circuit board illustrated in FIGS. 3A and 3B will be described. The converter analog control device according to the exemplary embodiment of the present invention may have a structure in which a plurality of printed circuit board layers are stacked and the filtering units 130 are disposed on a top layer and a bottom layer of the plurality of printed circuit board layers. A layer interposed between the top layer and the bottom layer in the stacked structure may not be exposed and therefore the filtering unit 130 may be disposed between the relatively exposed top layer and bottom layer.

Figure 3A:
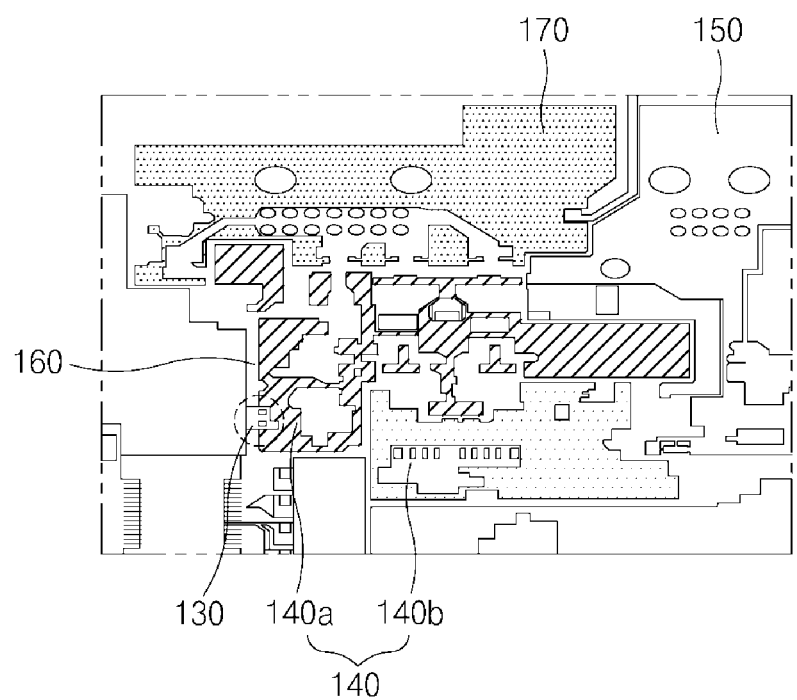
FIG. 3A is an exemplified diagram of a printed circuit board which is positioned on a bottom layer among a plurality of layers configuring the analog control device according to an exemplary embodiment of the present invention.
Figure 3B:
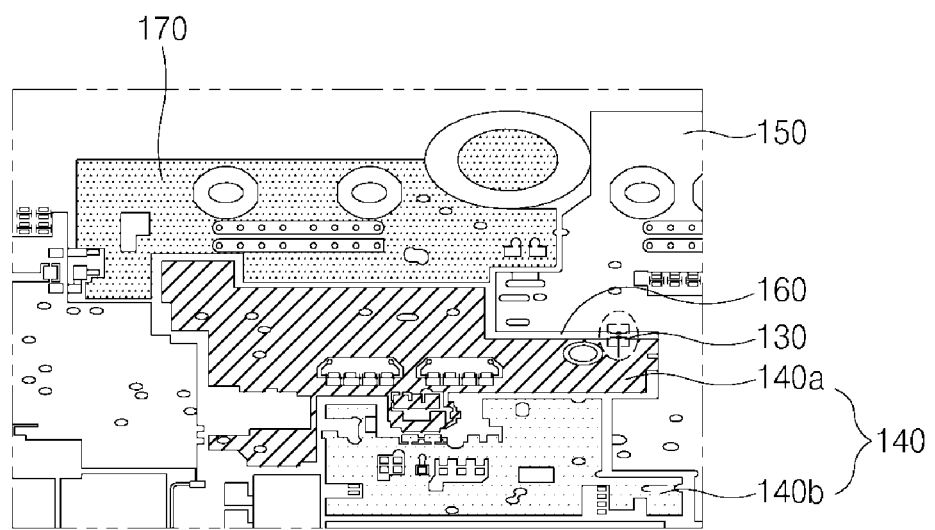
FIG. 3B is an exemplary diagram of the printed circuit board which is positioned on a top layer among the plurality of layers configuring the analog control device according to an exemplary embodiment of the present invention.
Figure 3C:
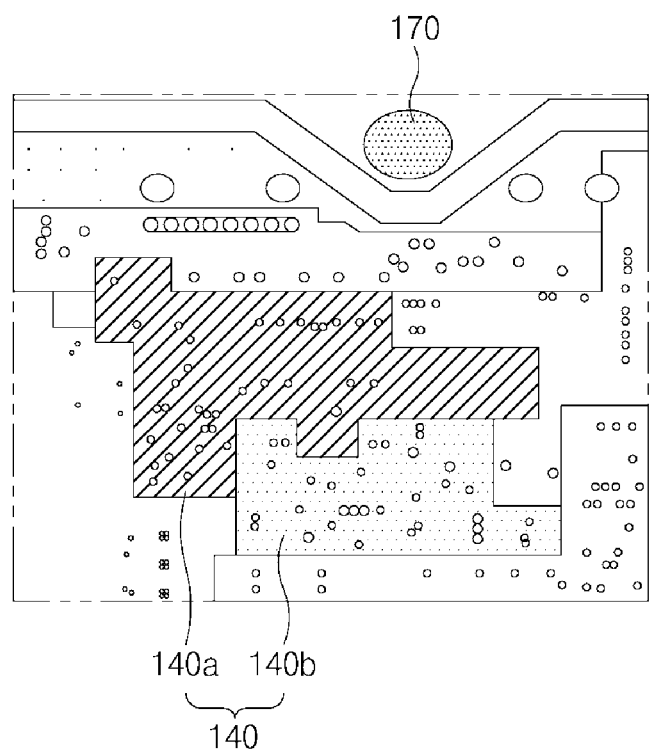
FIG. 3C is an exemplary diagram of the printed circuit board which is positioned on a second layer among the plurality of layers configuring the analog control device according to an exemplary embodiment of the present invention.
Figure 3D:
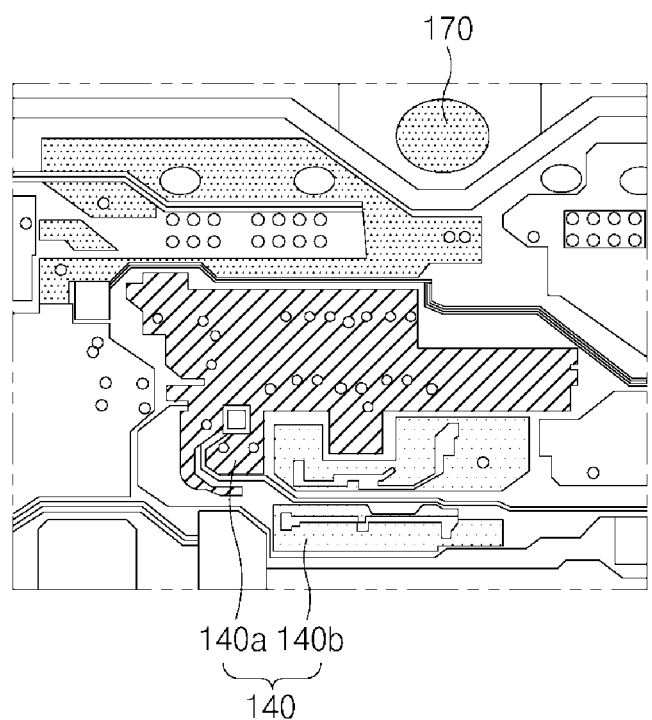
FIG. 3D is an exemplary diagram of the printed circuit board which is positioned on a third layer among the plurality of layers configuring the analog control device according to an exemplary embodiment of the present invention.
Figure 3E:
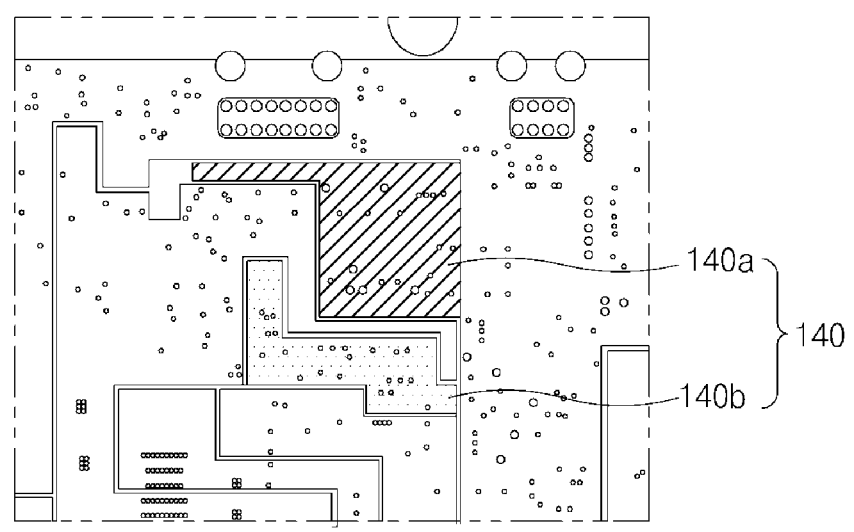
FIG. 3E is an exemplary diagram of the printed circuit board which is positioned on a fourth layer among the plurality of layers configuring the analog control device according to an exemplary embodiment of the present invention.
Figure 3F:
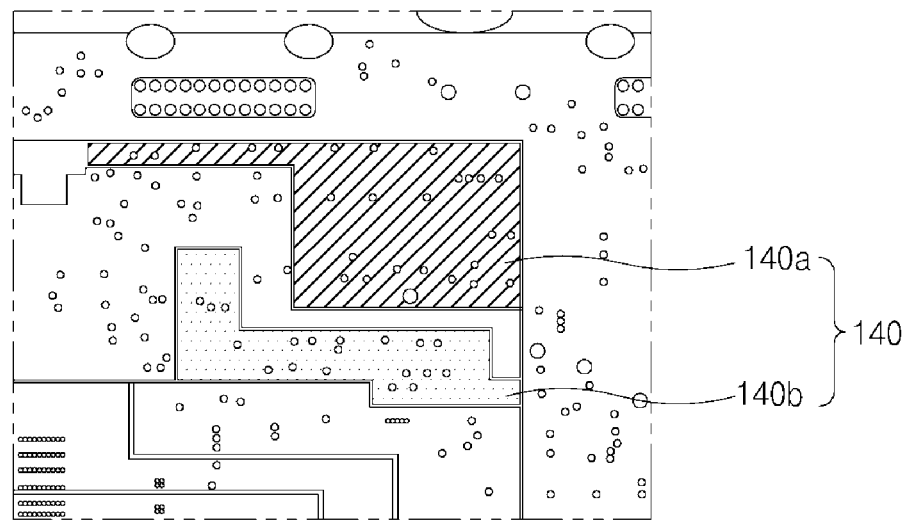
FIG. 3F is an exemplary diagram of the printed circuit board which is positioned on a fifth layer among the plurality of layers configuring the analog control device according to an exemplary embodiment of the present invention.

FIG. 3A is an exemplary diagram of a printed circuit board disposed on a bottom layer among a plurality of layers of the converter analog control device according to an exemplary embodiment of the present invention and FIG. 3B is an exemplary diagram of a printed circuit board disposed on a top layer among the plurality of layers of the converter analog control device according to an exemplary embodiment of the present invention. FIG. 3C is an exemplary diagram of the printed circuit board which is positioned on a second layer among the plurality of layers configuring the analog control device according to an exemplary embodiment of the present invention. FIG. 3D is an exemplary diagram of the printed circuit board which is positioned on a third layer among the plurality of layers configuring the analog control device according to an exemplary embodiment of the present invention. FIG. 3E is an exemplary diagram of the printed circuit board which is positioned on a fourth layer among the plurality of layers configuring the analog control device according to an exemplary embodiment of the present invention. FIG. 3F is an exemplary diagram of the printed circuit board which is positioned on a fifth layer among the plurality of layers configuring the analog control device according to an exemplary embodiment of the present invention.

As illustrated in FIGS. 3A and 3B, the printed circuit board may include a first ground voltage stage 140 and a second ground voltage stage 150, a third ground voltage stage 170, and the filtering unit 130, in which each of the ground voltage stages 140, 150 and 170 may be separately formed by being spaced from one another by a predetermined interval 160.

In particular, the first ground voltage stage 140 may be used in the PWM output unit 120 and divided into two regions 140a and 140b according to an exemplary embodiment. The second ground voltage stage 150 may be used in the integrated control unit 110 and a third ground voltage stage 170 may be connected to an external vehicle ground which may be a vehicle bolt (e.g., a bolt attached to the vehicle chassis) to discharge noise. The first ground voltage stage 140 and the second ground voltage stage 150 may be spaced apart from each other by the predetermined interval 160 to minimize an effect of noise therebetween. The predetermined interval 160 between the first ground voltage stage 140 and the second ground voltage stage 150 may be preferably set to be at least about 3 mm.

Further, a contact between the first ground voltage stage 140 and the second ground voltage stage 150 may be provided with the filtering unit 130 to filter an unnecessary signal, thereby transmitting and receiving a desired signal (e.g., with noise reduced or removed). As a result, the integrated control unit 110 may be least affected by the noise due to the PWM signal output from the PWM output unit 120. In particular, the filtering unit 130 may include an inductor, (e.g., a bead inductor), and the like and may include various devices with a filtering function. As such, according to an exemplary embodiment of the present invention, the second ground voltage stage 150 of the integrated control unit 110 and the first ground voltage stage 140 of the PWM output unit 120 may be formed separately on the printed circuit board of the analog control device to reduce or minimize the noise effect on the integrated control unit 110 due to the PWM output unit 120.

As illustrated in FIGS. 3C, 3D and 3E, layers interposed between the top layer and the bottom layer in the stacked structure don't include filtering unit 130. Moreover, according to an exemplary embodiment of the present invention, a contact between the second ground voltage stage 150 of the integrated control unit 110 and the first ground voltage stage 140 of the PWM output unit 120 may include the filtering unit 130 configured to pass a signal of a desired band, thereby blocking noise. Accordingly, an error in the voltage sensed in the input and output voltage of the converter 200 of the integrated control unit 110 may be reduced by blocking the noise due to the PWM output unit 120 to prevent the noise due to the PWM output unit 120 from being transferred to the integrated control unit 110.

Figure 4A:
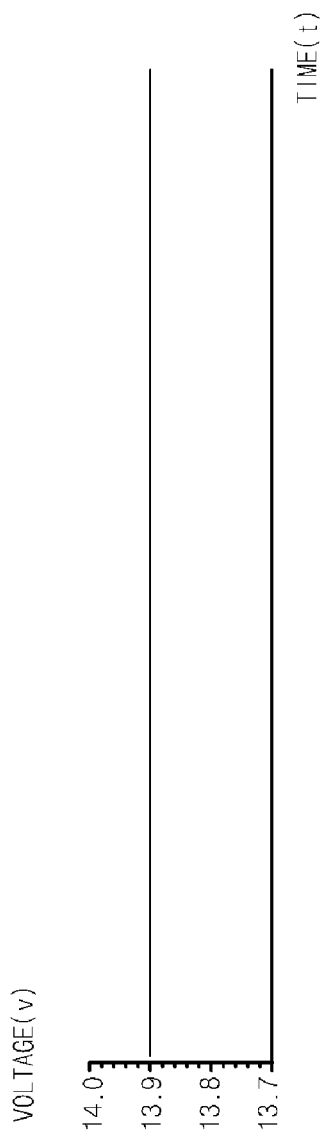
FIG. 4A is an exemplary graph illustrating a converter output voltage sensing result according to an exemplary embodiment of the present invention.
Figure 4B:
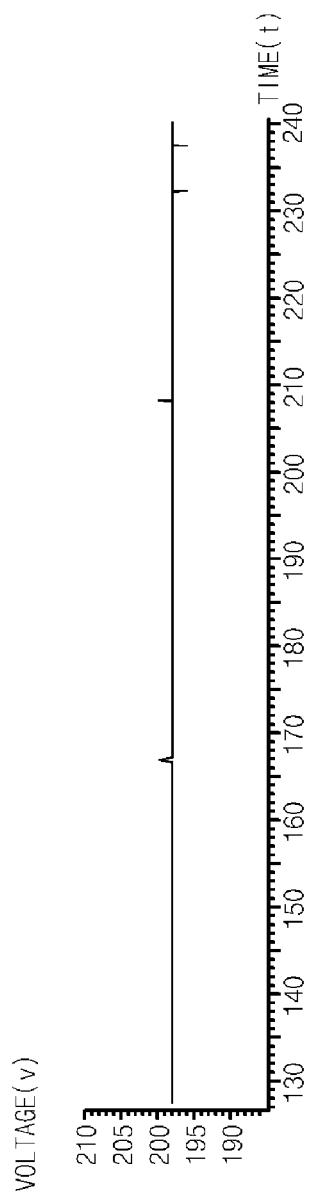
FIG. 4B is an exemplary graph illustrating a converter input voltage sensing result according to an exemplary embodiment of the present invention.

FIG. 4A is an exemplary graph illustrating a converter output voltage sensing result according to an exemplary embodiment of the present invention and FIG. 4B is an exemplary graph illustrating a converter input voltage sensing result according to an exemplary embodiment of the present invention. It may be appreciated from FIG. 4A that by applying the present technology, the output voltage of the converter 200 sensed by the integrated control unit 110 may be constantly maintained at about 13.9 V and minimal error may occur. Further, it may be appreciated that the input high voltage of the converter 200 sensed by the integrated control unit 110 may be constantly maintained and an error may range from about −5 V to +5 V. In addition, to prevent the noise generated from the PWM output unit 120 from being introduced there into, the noise may be leaked to the exterior through the third ground voltage stage 170 connected to an external vehicle ground and thus an adverse effect due to the noise may be reduced or minimized.

Therefore, according to an exemplary embodiment of the present invention, it may be possible to secure the control stability and reliability of the converter analog control device by changing the design of the printed circuit board of the converter analog control device. Further, it may be possible to increase the reliability of the converter output voltage by increasing the control stability and reliability of the converter analog control device and reduce costs since the separate sensor for sensing the converter output voltage may be omitted. As described above, according to the exemplary embodiments of the present invention, it may be possible to increase the accuracy of the voltage sensing result of the input and output voltages of the converter by removing the noise of the analog control device.

Exemplary embodiments of the present invention described above have been provided for illustrative purposes. Therefore, those skilled in the art will appreciate that various modifications, alterations, substitutions, and additions are possible without departing from the scope and spirit of the disclosure as disclosed in the accompanying claims and such modifications, alterations, substitutions, and additions fall within the scope of the present invention.

What is claimed is:

1. An analog controller configured to operate a converter in an electric vehicle battery charging system comprising:
   a pulse width modulation (PWM) output unit that outputs a PWM signal to the converter;
   an integrated control unit that senses an input voltage and an output voltage of the converter;
   a first ground voltage stage connected to the PWM output unit;
   a second ground voltage stage separated from the first ground voltage stage by a first predetermined interval and connected to the integrated control unit; and
   a filtering unit provided between the first ground voltage stage and the second ground voltage stage to pass an output signal of a predetermined band from the PWM unit to the integrated control unit.

2. The analog controller according to claim 1, further comprising:
a third ground voltage stage spaced apart from the first ground voltage stage and the second ground voltage stage by a second predetermined interval and connected to a vehicle ground for removing noise.

3. The analog controller according to claim 2, wherein the filtering unit includes an inductor configured to block noise and to pass the signal of the predetermined band to the integrated control unit.

4. The analog controller according to claim 3, wherein the inductor is a bead inductor.

5. The analog controller according to claim 1, wherein the first ground voltage stage and the second ground voltage stage are electrically connected through a single contact.

6. The analog controller according to claim 1, wherein the first ground voltage stage and the second ground voltage stage are spaced apart from each other by about 3 mm to 10 mm.

7. The analog controller according to claim 1, wherein the analog control system is implemented on a printed circuit board including a plurality of stacked layers.

8. The analog controller according to claim 7, wherein the filtering unit is disposed on a top layer and a bottom layer among the plurality of stacked layers at the same time.

* * * * *